(12) United States Patent
Ishikawa et al.

(10) Patent No.: US 12,116,219 B2
(45) Date of Patent: Oct. 15, 2024

(54) COMPONENT MOUNTER

(71) Applicant: FUJI CORPORATION, Chiryu (JP)

(72) Inventors: Kenzo Ishikawa, Kariya (JP); Kosei Baba, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 500 days.

(21) Appl. No.: 17/423,674

(22) PCT Filed: Feb. 19, 2019

(86) PCT No.: PCT/JP2019/006050
§ 371 (c)(1),
(2) Date: Jul. 16, 2021

(87) PCT Pub. No.: WO2020/170328
PCT Pub. Date: Aug. 27, 2020

(65) Prior Publication Data
US 2022/0119209 A1    Apr. 21, 2022

(51) Int. Cl.
*B65G 47/91*    (2006.01)
(52) U.S. Cl.
CPC .................................. *B65G 47/91* (2013.01)
(58) Field of Classification Search
USPC ........................................................ 348/126
See application file for complete search history.

(56) References Cited

U.S. PATENT DOCUMENTS 8,353,457 B2 *  1/2013  Olmstead ........... G06K 7/10702
                                                    235/462.41
2013/0120560 A1    5/2013  Nguyen

FOREIGN PATENT DOCUMENTS

| CN | 101902902 A | 12/2010 |
| JP | 10-93846 A | 4/1998 |
| JP | 11-272854 A | 10/1999 |
| JP | 2009-283572 A | 12/2009 |
| JP | 2013-172038 A | 9/2013 |

OTHER PUBLICATIONS

International Search Report issued on May 28, 2019 in PCT/JP2019/006050 filed on Feb. 19, 2019, 2 pages.

* cited by examiner

*Primary Examiner* — Mikhail Itskovich
(74) *Attorney, Agent, or Firm* — Oblon, McClelland, Maier & Neustadt, L.L.P.

(57) ABSTRACT

A component mounter including a camera device provided on a mounting head and configured to image an imaging target that falls within a camera visual field, and an optical device configured to form light paths corresponding individually to three or more imaging targets each including at least one of a holding member, a component held by the holding member, and a constituent member of the mounting head and configured to collect the three or more light paths so formed so as to enable the imaging targets to fall within the camera visual field while being aligned in a row direction and a column direction in the camera visual field.

11 Claims, 10 Drawing Sheets

COMPONENT MOUNTER

TECHNICAL FIELD

The present description relates to a component mounter.

BACKGROUND ART

A component mounter executes a mounting process of mounting a component held by a suction nozzle on a board. Patent Literature 1 discloses a component mounter including a camera device capable of imaging a suction nozzle from a side thereof. This component mounter recognizes a state of a component held by the suction nozzle based on the image data obtained through imaging by the camera device. The component mounter of Patent Literature 1 includes an optical device for forming a light path through which the camera device can simultaneously image four suction nozzles. As a result, as shown in FIG. 6 in Patent Literature 1, single image data includes images of the four suction nozzles.

PATENT LITERATURE

Patent Literature 1: JP-A-2009-283572

BRIEF SUMMARY

Technical Problem

In a configuration like the one described above, an increase in the number of suction nozzles constituting imaging targets narrows an occupied area of each of suction nozzles in a left-right direction of image data. As a result, for example, a reflection member or the like, which makes up a light source device, is required to be placed with high accuracy. In addition, when the occupied area of each suction nozzle narrows, there is a possibility that a part of a component held to the suction nozzle cannot fall properly within image data depending on the dimensions or holding state of the component.

An object of the present description is to provide a component mounter in which a camera device can image three or more imaging targets simultaneously and each imaging target can secure its occupied area sufficiently in a left-right direction of image data.

Solution to Problem

The present description discloses a component mounter including a mounting head configured to support one or multiple holding members for holding a component in such a manner as to enable the one or multiple holding members to be lifted up and lowered, a camera device configured to image an imaging target that falls within a camera visual field, and an optical device configured to form a light path enabling three or more imaging targets like the imaging target to fall within the camera visual field while being aligned in a row direction and a column direction that is orthogonal to the row direction in the camera visual field to thereby enable the camera device to simultaneously image the three or more imaging targets.

Advantageous Effects

With such a configuration, multiple light paths are collected so that the three or more imaging targets can be imaged simultaneously while being aligned in the row direction and the column direction in the camera visual filed of the camera device. As a result, the three or more imaging targets fall within image data obtained through imaging by the camera device while being caused to deviate in a left-right direction and an up-down direction. Thus, compared with the conventional configuration in which multiple imaging targets are caused to fall within the image data while being aligned in the left-right direction, with the configuration according to the present description, an occupied area for each imaging target can be secured sufficiently in the left-right direction of the image data.

FIG. I is a side view showing a light path formed by an optical device in a deployed fashion.

Figure 5:
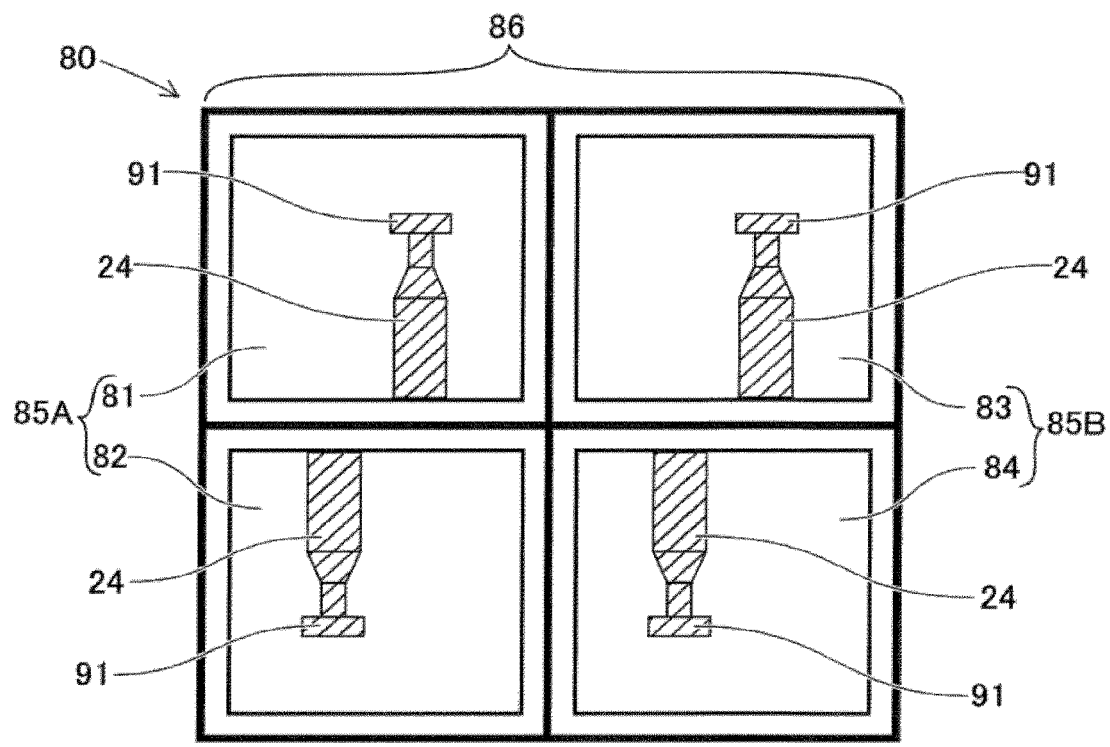

FIG. 5 is a diagram showing image data obtained through imaging by a camera device.

Figure 6:
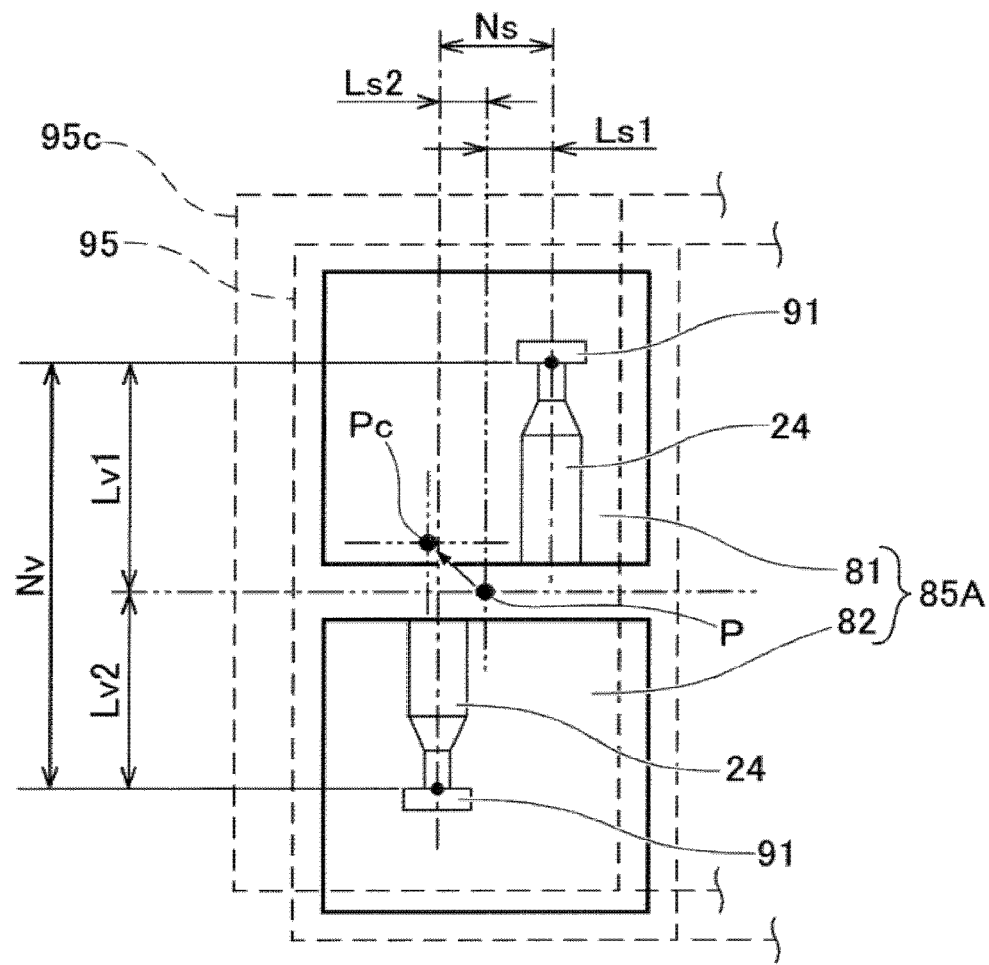

FIG. 6 is a diagram showing a relationship between mapping of an imaging target object and a visual field of a camera of the camera device.

Figure 7:
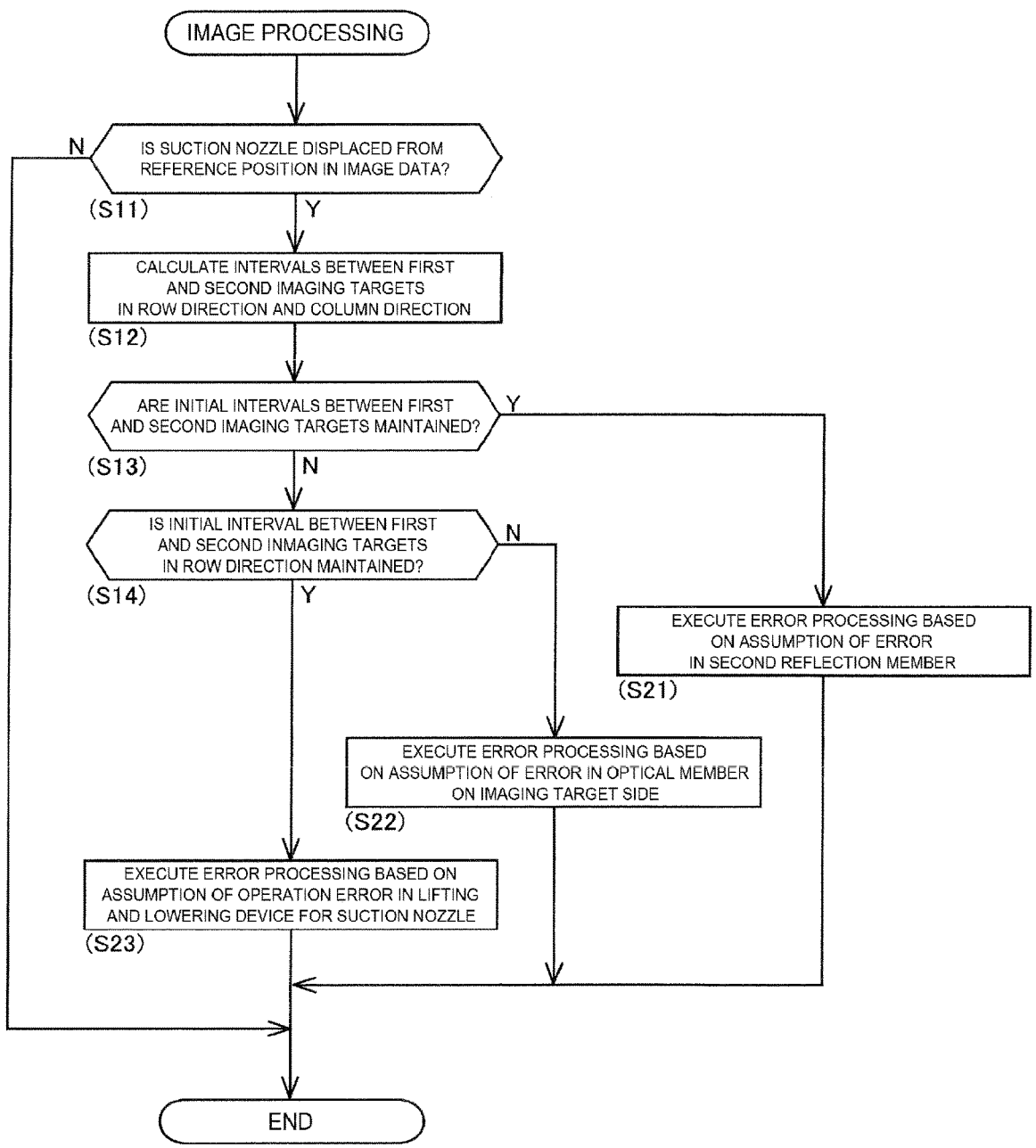

FIG. 7 is a flowchart showing image processing performed by the component mounter.

Figure 8A:
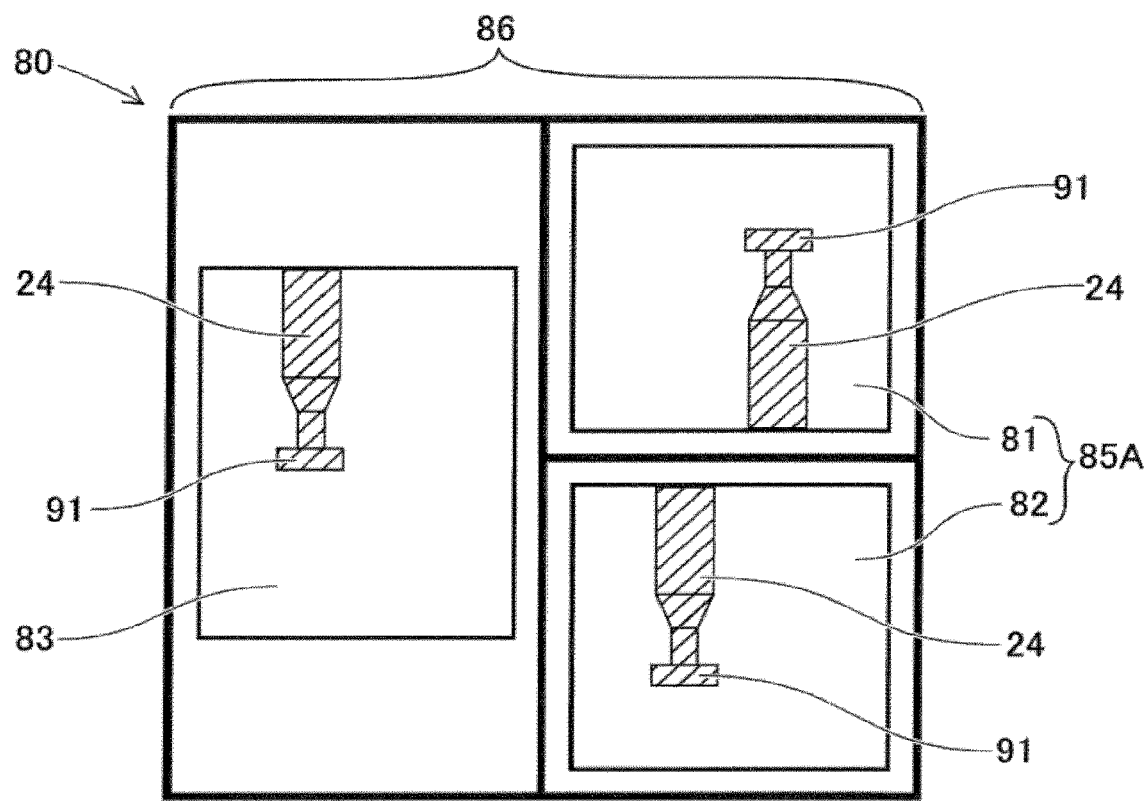

FIG. 8A is a diagram showing image data according to a first aspect of a modified form in which three imaging targets are arranged.

Figure 8B:
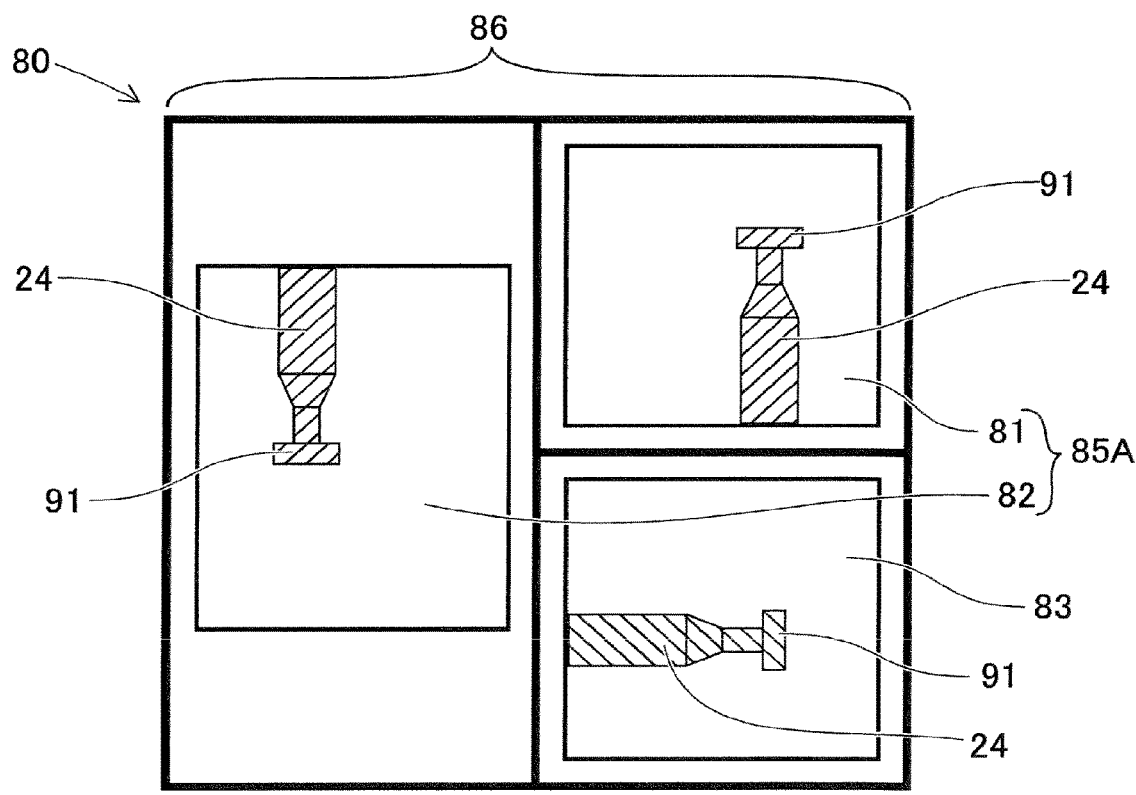

FIG. 8B shows image data according to a second aspect of the modified mode in which three imaging targets are arranged.

Figure 9:
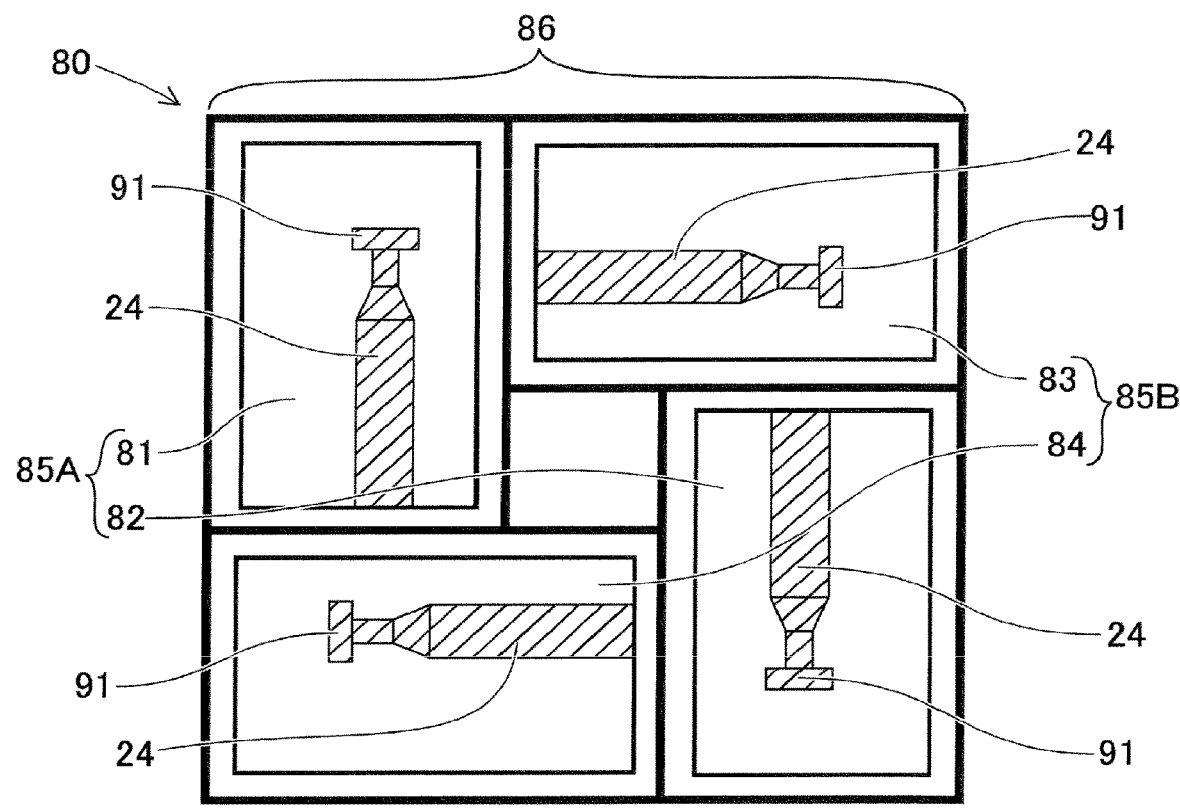

FIG. 9 shows image data according to a modified form in which four imaging targets are arranged.

Figure 10:
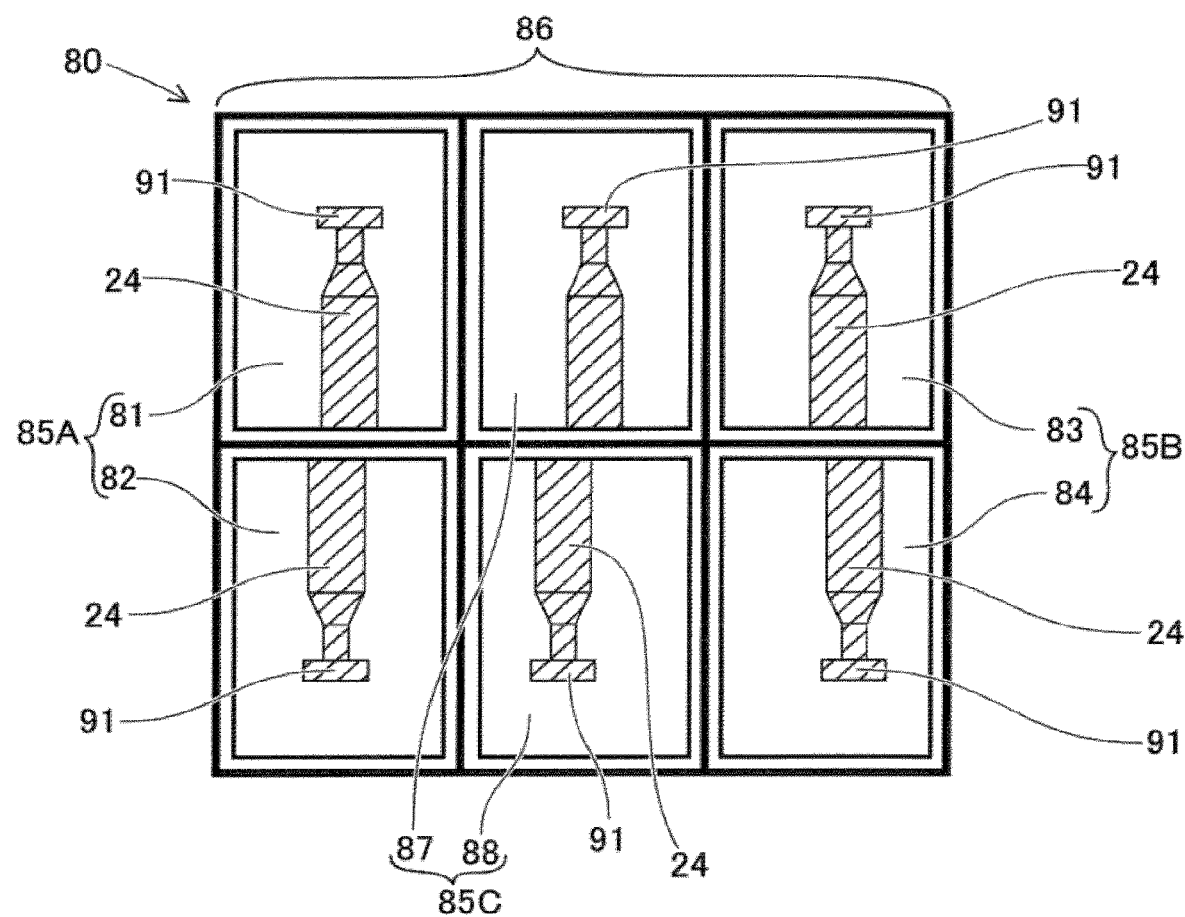

FIG. 10 shows image data according to a modified form in which six imaging targets are arranged.

DESCRIPTION OF EMBODIMENTS

1. Configuration of Component Mounter 1

Figure 1:
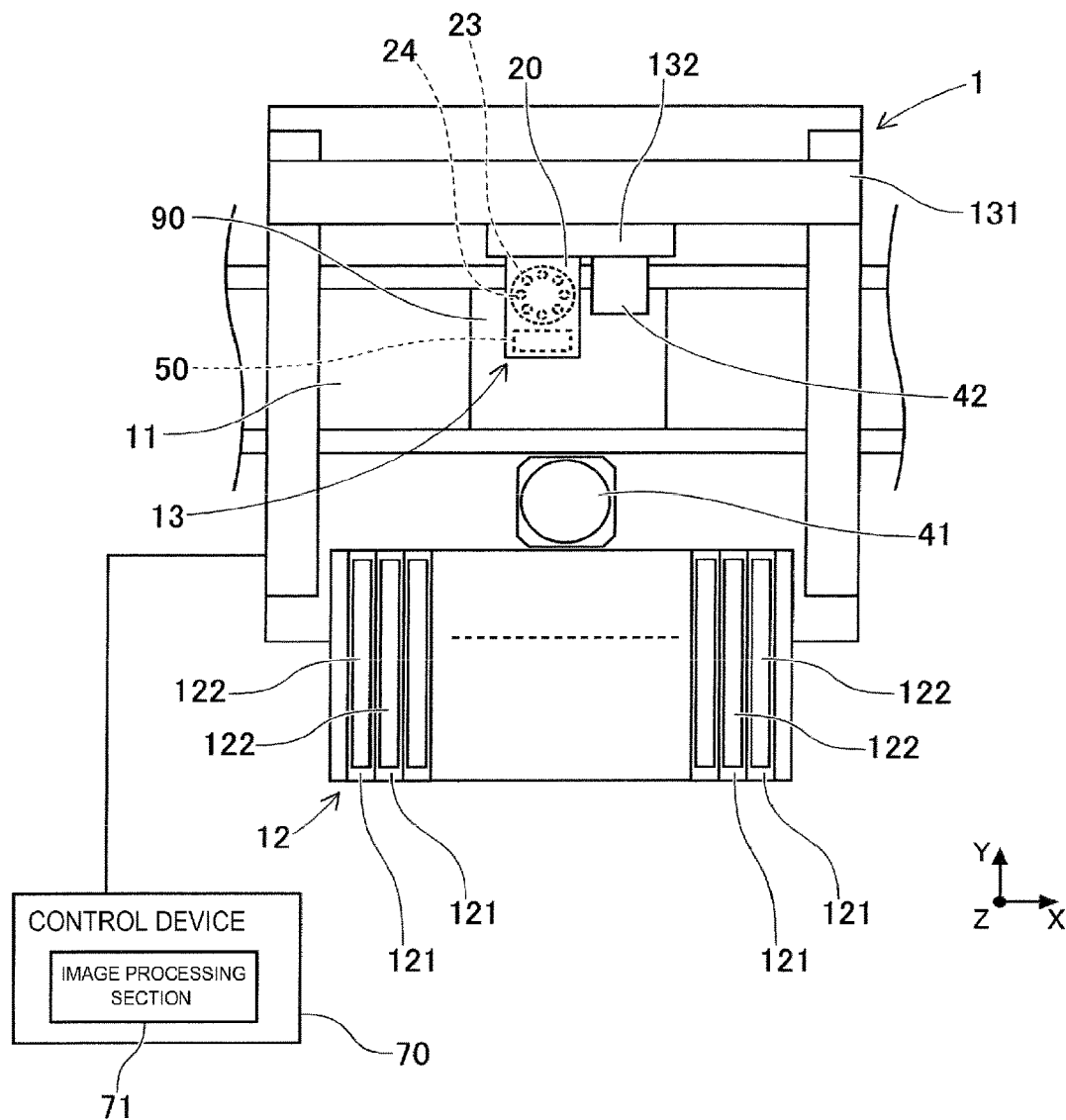
FIG. 1 is a schematic view showing a configuration of a component mounter of an embodiment of the present description.

As shown in FIG. 1, component mounter 1 includes board conveyance device 11, component supply device 12, component transfer device 13, part camera I 1, board camera I 2, head camera unit 50, and control device 70. In the following description, a left-right direction of component mounter 1 in a horizontal direction is referred to as an X-direction, a front-rear direction of component mounter 1 in a horizontal direction orthogonal to the X-direction is referred to as a Y-direction, and a vertical direction (a front-rear direction in FIG. 1) orthogonal to the X-direction and the Y-direction is referred to as a Z-direction.

Board conveyance device 11 is made up of a belt conveyor, a positioning device, and the like. Board conveyance device 11 sequentially conveys board 90 in a conveyance direction and positions board 90 so conveyed in a predetermined position in component mounter 1. Board conveyance device 11 conveys board 90 out of component mounter 1 after a mounting process has been finished thereon. Component supply device 12 supplies components that are to be mounted on board 90. Component supply device 12 includes feeders 122 that are set individually in multiple slots 121. Feeder 122 supplies multiple components in such a manner as to be picked up by moving to feed a carrier tape in which those multiple components are housed.

Component transfer device 13 transfers a component supplied by component supply device 12 to a predetermined mounting position on board 90 that is conveyed into component mounter 1 by board conveyance device 11. Head driving section 131 of component transfer device 13 moves moving table 132 in the horizontal directions (the X-direction and the Y-direction) by a linear motion mechanism. Mounting head 20 is fixed to moving table 132 with a clamp member, not shown, in an exchangeable fashion.

Mounting head 20 supports one or multiple holding members configured to hold a component supplied by component supply device 12 in such a manner as to allow the holding member or holding members to be lifted up and lowered. In the present embodiment, mounting head 20 supports eight holding members. Mounting head 20 mounts components in predetermined mounting positions on board 90 by picking up them with the holding members. For example, suction nozzle 2I (refer to FIG. 2) configured to hold a component through suction when a negative pressure air is supplied thereto, a chuck configured to hold a component through clamping, or the like can be adopted for the holding member described above. The configuration of mounting head 20 will be described in detail later on.

Part camera I 1, board camera I 2, and head camera unit 50 are a digital imaging device having an imaging element such as CMOS or the like. Part camera I 1, board camera I 2, and head camera unit 50 execute imaging based on a control signal and transmit image data obtained through such imaging. Part camera I 1 is configured to image a component held by suction nozzle 2I of mounting head 20 from therebelow. Board camera I 2 is configured to image board 90 from thereabove.

Figure 2:
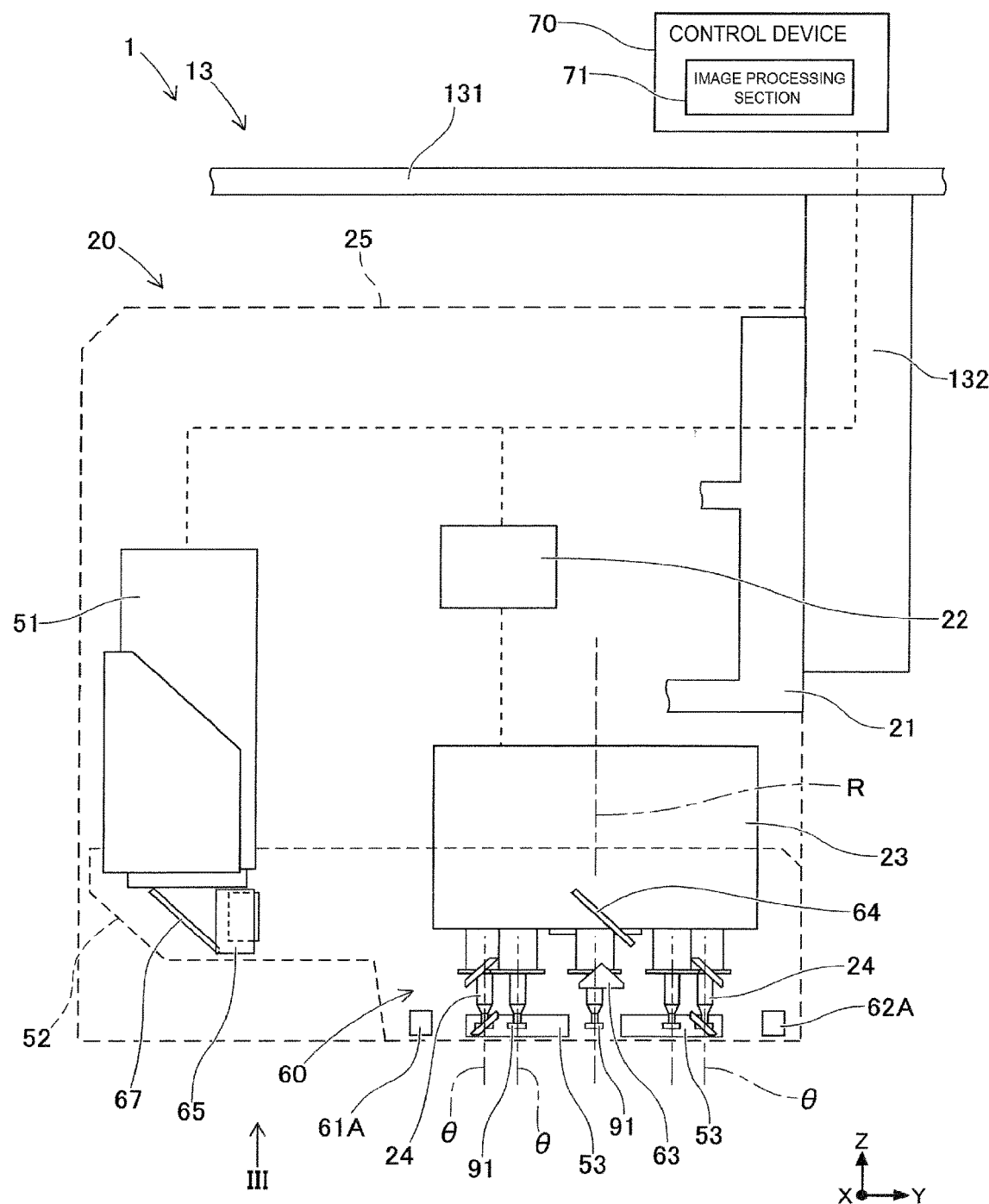
FIG. 2 is a side view schematically showing a portion of a mounting head.

As shown in FIG. 2, head camera unit 50 is provided in an interior portion of mounting head 20 and moves together with mounting head 20 as moving table 132 moves. Head camera unit 50 images a target object in a mounting process. In the present embodiment, head camera unit 50 is configured to be able to image suction nozzle 2I and a component held by suction nozzle 2I from a side thereof. The configuration of head camera unit 50 will be described in detail later on.

Control device 70 is mainly made up of CPU, various memories, and a control circuit. Control device 70 executes mounting processing of mounting a component on board 90. In the present embodiment, control device 70 includes image processing section 71 as shown in FIG. 1. Image processing section 71 performs predetermined image processing on image data obtained through imaging by head unit camera 50 or the like. Specifically, image processing section 71 executes, for example, binarization, edge processing, or the like on the image data so obtained. Then, image processing section 71 recognizes whether a component exists at a distal end of suction nozzle 2I, an orientation of a component relative to suction nozzle 2I, and the like.

In the mounting processing, control device 70 controls the operation of mounting head 20 based on information and measured values that are outputted from various types of sensors, a result of image processing performed by image processing section 71, a control program for designating a mounting position on board 90, and the like. As a result, the position and angle of suction nozzle 2I supported on mounting head 20 are controlled. In addition, in the present embodiment, image processing section 71 is used to detect an abnormal operation of a driving device as a lifting and lowering device for lifting up and lowering suction nozzle 2I, an abnormal placement of optical device 60 of head camera unit 50, and the like based on the image data obtained as described above. Image processing section 71 will be described in detail later on.

2. Detailed Configuration of Mounting Head 20

As shown in FIG. 2, mounting head 20 includes head main body 21, driving device 22, rotary head 23, suction nozzles 2I, and housing 25. Head main body 21 is a frame member detachably provided on moving table 132. Driving device 22 is a motor or an actuator for operating various types of driven sections provided on mounting head 20.

Rotary head 23 is provided on head main body 21 in such a manner as to rotate around an R-axis that is parallel to a vertical axis (Z-axis). Rotary head 23 holds multiple (for example, eight) syringes, which are arranged at equal intervals in a circumferential direction along a circumference which is concentric with an R-axis, in such a manner that the syringes are lifted up and lowered in the Z-direction. Suction nozzles 2I are attached individually to lower end portions of the syringes. As a result, rotary head 23 supports the multiple suction nozzles 2I in such a manner as not only to be lifted up and lowered with respect to head main body 21 but also to rotate around a θ-axis which is parallel to the R-axis and passes through a center of suction nozzle 2I.

Suction nozzle 2I is a holding member configured to pick up a component through suction when a negative pressure air is supplied thereto. Multiple suction nozzles 2I are angularly positioned at predetermined angles around the R-axis as a result of rotation of rotary head 23 that occurs in association with driving of driving device 22. In addition, suction nozzles 2I are caused individually to rotate around the θ-axes (on their own axes) as a result of operation of driving device 22, and their rotation angles and rotation speeds are controlled. Further, in multiple suction nozzles 2I, suction nozzle 2I indexed to lifting and lowering position H0 (refer to FIG. 3) is lifted up and lowered in the Z-direction as a result of operation of driving device 22, and its Z-direction position and movement speed are controlled.

Housing 25 is formed into a box-like shape so as to accommodate head main body 21, head camera unit 50, and the like therein. A lower portion of housing 25 is opened so that part camera I 1 can image components held by multiple suction nozzles 2I that are supported on rotary head 23 from below. Mounting head 20, which is configured as described above, is connected with control device 70 of component mounter 1 in such a manner as to communicate therewith. Mounting head 20 is such that the operation of driving device 22 is controlled based on a command inputted from control device 70, detection values of various types of sensors provided inside mounting head 20, or the like.

Figure 3:
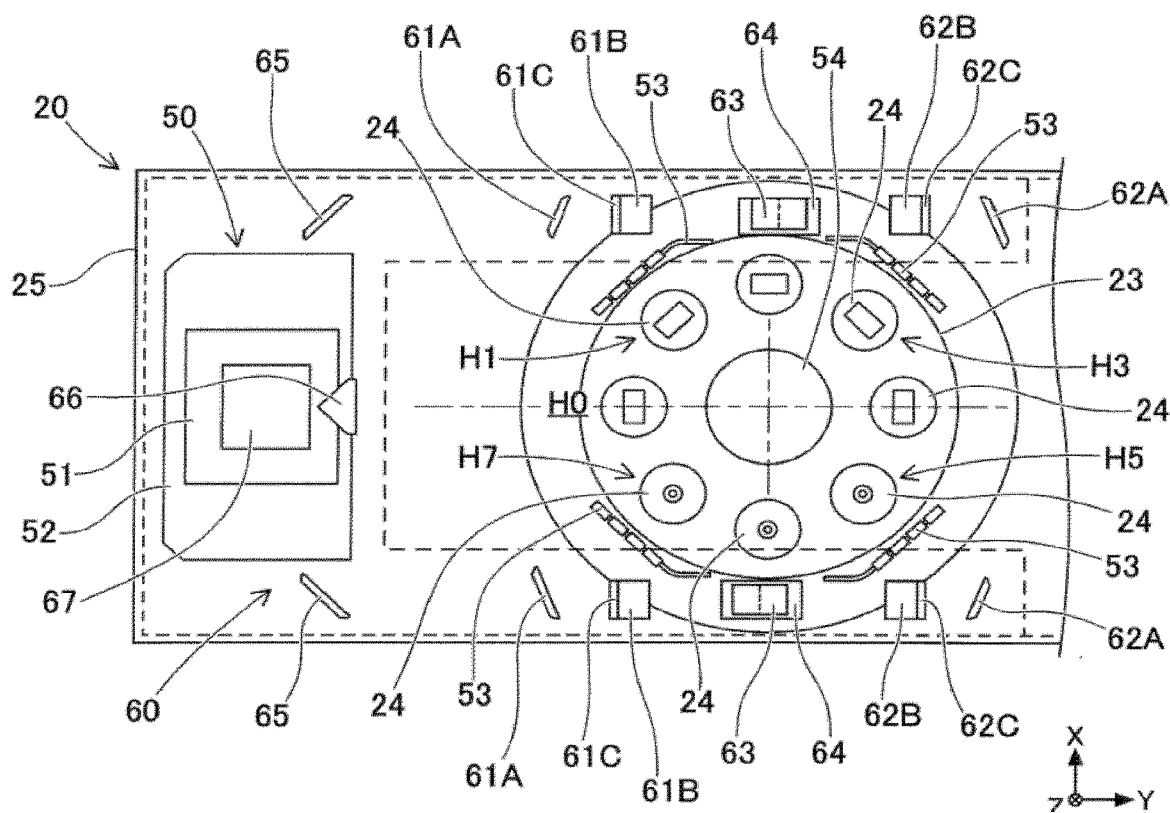
FIG. 3 is a view as seen in a direction indicated by arrow 4A4 in FIG. 2.
Figure 4:
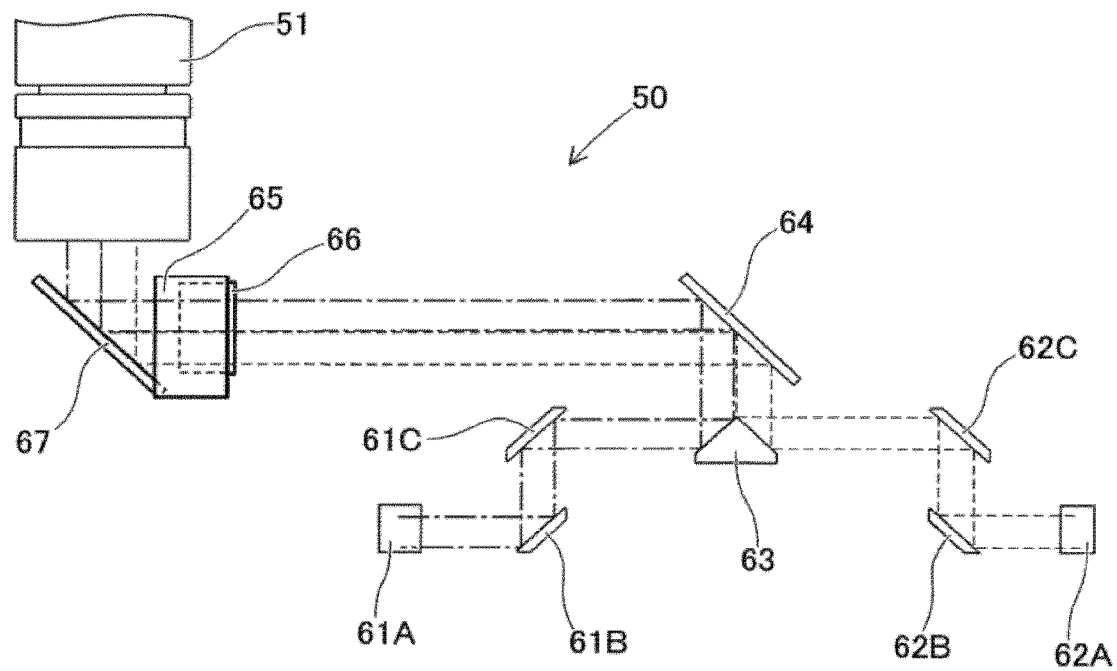

Hereinafter, as shown in FIG. 3, positions where individual suction nozzles 2I are indexed are referred to as first standby position H1 to seventh standby position H7 in a clockwise direction based on lifting and lowering position H0 where suction nozzle 2I is lifted up and lowered by mounting head 20 as a reference position. First standby position H1 is a position where to keep suction nozzle 2I that is to be indexed next time to lifting and lowering position H0 as a result of rotation of rotary head 23 standing by. Seventh standby position H7 is a position where to keep suction nozzle 2I that is to be indexed seven times later to lifting and lowering position H0 as a result of rotation of rotary head 23 standing by and is also a position where to keep suction nozzle 2I that has been indexed to lifting and lowering position H0 before standing by.

3. Detailed Configuration of Head Camera Unit 50

As described above, head camera unit 50 moves together with mounting head 20 in association with movement of moving table 132. Head camera unit 50 images sideways suction nozzle 2I and component 91 held by suction nozzle 2I based on an imaging command issued by control device 70. Image data 80 (refer to FIG. 5) resulting from the imaging so carried out is sent out to control device 70 to be used for a holding inspection of component 91, or the like.

As shown in FIG. 2, head camera unit 50 includes camera device 51, bracket 52, light sources 53, backing member 5I, and optical device 60. In the present embodiment, camera device 51 is provided on head main body 21 via bracket 52 in such a manner that an optical axis thereof becomes parallel to the vertical axis (Z-axis). Camera device 51 is provided on mounting head 20 to image an imaging target that falls within camera visual field 95 (refer to FIG. 6). In the present embodiment, camera device 51 images suction nozzle 2I irradiated with light emitted by light source 53 and component 91 held by suction nozzle 2I as imaging targets.

Bracket 52 is a fixing member for fixing camera device 51 to head main body 21. Light sources 53 are disposed on bracket 52 to irradiate corresponding imaging targets with light when the imaging targets are imaged by camera device 51. In the present embodiment, light source 53 is made up of multiple light emitting diodes or the like that are configured to emit ultraviolet rays in the direction of a center of rotary head 23 (a direction towards the R-axis). In addition, light sources 53 are designed to emit light to four corresponding suction nozzles 2I that are positioned in first standby position H1, third standby position H3, fifth standby position H5, and seventh standby position H7.

Baking member 5I is formed into a cylindrical shape, and a phosphor layer, which is configured to absorb ultraviolet rays and emit visible light, is formed on a cylindrical outer peripheral surface thereof. Backing member 5I is disposed at a lower end of rotary head 23 in such a manner as to be coaxial with the R-axis. Backing member 5I rotates together with rotary head 23. Backing member 5I is a member that constitutes a background in image data 80 obtained through imaging by camera device 51.

Optical device 60 forms three or more light paths corresponding individually to three or more imaging targets and collects the three or more light paths so that the three or more imaging targets can fall within camera visual field 95 while being aligned in a row direction (a left-right direction in FIG. 5) and a column direction (an up-down direction in FIG. 5) orthogonal to the row direction in camera visual field 95. In other words, optical device 60 optically changes the positional relationship among the three or more imaging targets so that the three or more imaging targets can fall within camera visual field 95 while being aligned in the row direction and the column direction, which is orthogonal to the row direction, in camera visual field 95.

Here, camera device 51 of head camera unit 50 takes three or more objects including at least one of a holding member (for example, suction nozzle 2I), component 91 held by the holding member, and a constituent members of mounting head 20 as imaging targets. In the present embodiment, camera device 51 images four suction nozzles 2I that are positioned in first standby position H1, third standby position H3, fifth standby position H5, and seventh standby position H7 or components 91 that are held by those suction nozzles 2I as imaging targets.

Then, optical device 60 adopts a configuration in which four imaging targets are caused to fall within camera visual field 95 with each two of the four imaging targets being aligned in the row direction and the column direction, as shown in FIG. 5. Further, with optical device 60, in the four imaging targets, two imaging targets, that is, a first imaging target (suction nozzle 2I in first standby position H1) and a second imaging target (suction nozzle 2I in third standby position H3) are caused to fall within camera visual field 95 while being aligned in the column direction in such a state that the first imaging target and the second imaging target are reversed to each other in the up-down direction and the left-right direction. Similarly, with optical device 60, in the four imaging targets, the remaining two imaging targets (suction nozzle 2I in the seventh standby position H7, suction nozzle 2I in the fifth standby position H5) are caused to fall within camera visual field 95 while being aligned in the column direction in such a state that the remaining two imaging targets are reversed to each other.

Specifically, optical device 60 includes pairs of front objective mirrors 61A, 61B, 61C, pairs of rear objective mirrors 62A, 62B, 62C, pair of side prisms 63, pair of first side mirrors 6I, pair of second side mirrors 65, center prism 66, and center mirror 67, each pair of objective mirrors, the pair of side prisms, the pair of first side mirrors, and the pair of second side mirrors being arranged in the left-right direction (the up-down direction in FIG. 3). Since optical device 60 is configured to be substantially symmetrical laterally, only a left-hand side configuration (an upper-side configuration in FIG. 3) will be described here.

As shown in FIGS. 3 and I, three front objective mirrors 61A, 61B, 61C are optical members that form a light path in which a silhouette image of suction nozzle 2I in first standby position H1 and component 91 held thereto constitutes mapping 81 (refer to FIG. 5) with backing member 5I constituting a background thereof. This light path enables mapping 81 to be incident on side prism 63 from a front side. On the other hand, three rear objective mirrors 62A, 62B, 62C are optical members that form a light path in which a silhouette image of suction nozzle 2I in third standby position H3 and component 91 held thereto constitutes mapping 82 with backing member 5I constituting a background thereof. This light path enables mapping 82 to be incident on side prism 63 from a rear side.

Side prism 63 combines two mappings 81, 82 that are incident thereon in the up-down direction to form a light path that is refracted upwards. At this time, first combined mapping 85A (refer to FIG. 5) is generated in which mapping 82 of a second imaging target is reversed in the up-down direction and the left-right direction to mapping 81 of a first imaging target and is aligned with that mapping 81 in the up-down direction. In first combined mapping 85A, lateral and vertical deviations between those mappings 81, 82 could be generated as a result of placement errors of those three front objective mirrors 61A, 61B, 61C and those three rear objective mirrors 62A, 62B, 62C.

First side mirror 6I is a first reflection member configured to reflect first combined mapping 85A that is incident thereon from side prism 63 towards camera device 51. First side mirror 6I is provided at a center section of mounting head 20 in a direction in which the first imaging target and the second imaging target are disposed (in a front-rear direction of mounting head 20, a left-right direction in FIG. 3). Second side mirror 65 reflects first combined mapping 85A that is incident thereon from the first side mirror 6I towards a center of mounting head 20 in a left-right direction thereof. As a result, first combined mapping 85A is incident on center prism 66 from a left side thereof. In addition, as a result of the right-hand side configuration being formed generally laterally symmetrical with the configuration that has been described heretofore, first combined mapping 85B is incident on center prism 66 from a right-hand side thereof.

That first combined mapping 85B is a mapping in which mapping 8I of a fourth imaging target is reversed in the up-down direction and the left-right direction to mapping 83 of a third imaging target and is aligned with that mapping 83 in the up-down direction, as shown in FIG. 5. Center prism 66 combines two first combined mappings 85A, 85B that are incident thereon in the left-right direction to form a light path that is refracted to a front side. At this time, second combined mapping 86 is generated in which those two first combined mappings 85A, 85B are aligned in the left-right direction.

Center mirror 67 is a second reflection member configured to reflect second combined mapping 86 that is incident thereon from center prism 66 towards camera device 51. Four light paths are collected by optical device 60 that is configured as described above, whereby second combined mapping 86 is caused to fall within camera visual field 95 of camera device 51. In other words, a positional relationship among four imaging targets is optically changed by optical device 60, whereby the four imaging targets are caused to fall within camera visual field 95 of camera device 51. Then, image data 80 in which mappings 81 to 81 of the four imaging targets are aligned in the row direction and the column direction in a two-by-two configuration is obtained by camera device 51.

Here, in a case that component 91 is included in an imaging target by image data 80, an occupied area of component 91 in question that is required to cause that component 91 to fall within camera visual field 95 in an ensured fashion is desirably greater than an ideal area resulting from adding a design tolerance of that component 91 to a circle that is centered at a θ-axis of suction nozzle 2I and whose radius corresponds to a longitudinal length of that component 91. This is because there may occur a case in which suction nozzle 2I comes into contact with a longitudinal end portion of component 91, which deviates from a central section thereof, to hold component 91 in question.

Therefore, when image data is generated by aligning three or more imaging targets in the left-right direction as with conventional art, there is a possibility that occupied areas of individual imaging targets become smaller than the ideal area described above. In addition, even in the event that occupied areas can be secured for the individual imaging targets, in a case that a difference in size between the occupied areas so secured and the ideal areas is small, a placement accuracy that is required on an optical member for forming a light path becomes high.

In contrast to this, with optical device 60 that is configured as has been described heretofore, three or more imaging targets fall within image data 80 while being caused to deviate in the left-right direction and the up-down direction. As a result, as compared with the conventional configuration in which image data is generated by aligning three or more imaging targets in the left-right direction, the occupied areas of the individual imaging targets can be secured sufficiently in the left-right direction of image data 80. Further, since the difference in size between the occupied areas of the individual imaging targets and the ideal areas thereof can be increased, the increase in placement accuracy required on optical device 60 can be suppressed.

In addition, optical device 60 described above forms four light paths so that lengths of the four light paths fall within a permissible range based on a depth of field of camera device 51. Specifically, the first imaging target (suction nozzle 2I in first standby position H1) is located in a position closer to camera device 51 than the second imaging target (suction nozzle 2I in third standby position H3), lengths of the light paths thereof are adjusted so as to be substantially equal as a result of mappings 81, 82 thereof following the light paths by way of side prism 63.

Then, although the lengths of the four light paths could involve a certain degree of difference, the lengths fall within a permissible range based on the depth of field of camera device 51. As a result, camera device 51 is configured to be able to image simultaneously four imaging targets that are each in focus without adjusting focal points during imaging processing. As a result, a camera with a fixed focus can be adopted for head camera unit 50, thereby making it possible to reduce the equipment costs. Head camera unit 50 generates image data 80 as shown in FIG. 5 through imaging by camera device 51 and sends out image data 80 so generated to control device 70.

I. Image Processing by Image Processing Section 71

Image processing section 71 executes, for example, a binarization, edge processing, or the like on image data 80 that image processing section 71 has obtained. Then, image processing section 71 recognizes the presence or absence, shapes, positions in the lifting and lowering direction, and the like of four suction nozzles 2I. In addition, image processing section 71 recognizes the presence or absence and shapes of components 91 at distal ends of four suction nozzles 2I, orientations of those components 91 relative to corresponding suction nozzles 2I, and the like.

Control device 70 determines, for example, whether suction nozzles 2I need maintenance work and whether driving device 22 operates properly based on the results of image processing carried out as described above. Further, control device 70 causes a mounting operation matching an orientation of component 91 to take place in a mounting processing and determines whether component 91 is mounted properly based on the results of image processing carried out as described above. In this way, with component mounter 1 described heretofore, states of suction nozzle 2I or the like before and after suction nozzle 2I or the like is mounted are recognized based on the image processing using head camera unit 50 so as to improve the mounting accuracy.

Incidentally, image processing section 71 recognizes a position of suction nozzle 2I in the lifting and lowering direction thereof in order to determine, for example, whether driving device 22 of mounting head 20 is operating normally. Specifically, in a case that suction nozzle 2I is displaced in the up-down direction with respect to reference position P of image data 80 as shown in FIG. 6, image processing section 71 can assume that there is occurring a positioning error of suction nozzle 2I in the lifting and lowering direction due to an abnormal operation of driving device 22.

However, there may be a case in which a placement error occurs in an optical member that constitutes optical device 60 as a result of the mounting process being executed repeatedly, or the like. Then, even though driving device 22 is operating normally, there is a possibility that driving device 22 is recognized erroneously as performing an abnormal operation because suction nozzle 2I is displaced in the up-down direction from reference position P of image data 80. In contrast to this, component mounter 1 of the present embodiment adopts a configuration in which optical device 60 and image processing section 71 prevent the occurrence of the erroneous recognition described above.

Specifically, optical device 60, which is configured as described above, generates first combined mapping 85A in which mapping 82 of the second imaging target (suction nozzle 2I in third standby position H3) is reversed in the up-down direction and the left-right direction to mapping 81 of the first imaging target (suction nozzle 2I in first standby position H1). In addition, control device 70 defines and stores a normal initial state based on image data 80 when head camera unit 50 is attached to mounting head 20.

The initial state includes, as illustrated in FIG. 6, distances Ls1, Ls2 of two mappings 81, 82 in the row direction and distances Lv1, Lv2 thereof in the column direction relative to reference position P of image data 80 (in the present embodiment, distances from reference position P to distal ends of suction nozzles 2I). The initial state may include inclinations of mappings 81, 82.

Then, image processing section 71 determines whether at least one of the first imaging target and the second imaging target is displaced in the row direction or the column direction from reference position P of image data 80 that is obtained through imaging by camera device 51. If such a displacement is determined to be occurring, image processing section 71 estimates a cause for the occurrence of the displacement based on a positional relationship between the first imaging target and the second imaging target in image data 80.

Specifically, image processing section 71 executes an image processing like one shown in FIG. 7, if image data 80 is obtained by head camera unit 50 during execution of the mounting processing. First, image processing section 71 determines whether at least one of multiple suction nozzles 2I is displaced from reference position P in image data 80 (S11). Specifically, image processing section 71 determines whether the displacement is occurring by calculating distances Ls1, Ls2 of two mappings 81, 82 in the row direction and distances Lv1, Lv2 thereof in the column direction in current image data 80 and determining whether variations from those in the initial state exceed a permissible range.

Here, if none of suction nozzles 2I is so displaced (S11: No), image processing section 71 ends this processing and executes various types of recognition processing using image data 80. On the other hand, if at least one suction nozzle 2I is so displaced from reference position P (S11: Yes), image processing section 71 calculates row interval Ns between the first and second imaging targets in the row direction and column interval Nv therebetween in the column direction (S12).

Next, image processing section 71 determines whether the first imaging target and the second imaging target in image data 80 maintain initial intervals (Ls1+Ls2, Lv1+Lv2). Here, even though the displacement is occurring, if current row interval Ns is equal to the initial row-direction interval (Ls1+Ls2) and current column interval Nv is equal to the initial column-direction interval (Lv1+Lv2), it means that second combined mapping 86 is shifted with respect to camera visual 95 as a whole (refer to camera visual field 95 having reference position Pc in FIG. 6).

Then, if the first imaging target and the second imaging target maintain the initial intervals (S13: Yes), image processing section 71 executes an error processing based on an assumption that a placement error of the optical member for forming a light path after second combined mapping 86 has been generated, that is, center mirror 67 constitutes a cause for the displacement (S21). Specifically, image processing section 71 notifies an operator of, for example, execution of angle adjustment of center mirror 67.

On the other hand, if the first imaging target and the second imaging target do not maintain the initial interval (S13: No), image processing section 71 determines whether the first imaging target and the second imaging target maintain the initial interval in the row direction (Ls1+Ls2). Here, if current row interval Ns is different from the initial interval in the row direction (Ls1+Ls2) and current column interval Nv is equal to the initial interval in the column direction (Lv1+Lv2), it means that first combined mapping 85 is shifted with respect to camera visual field 95.

Then, if the first imaging target and the second imaging target do not maintain the initial row-direction interval (Ls1+Ls2) (S1I: No), image processing section 71 executes an error processing based on an assumption that a placement error of the optical members for forming a light path before first combined mapping 85 has been generated, that is, front objective mirrors 61A, 61B, 61C and rear objective mirrors 62A, 62B, 62C constitutes a cause for the displacement (S22). Specifically, image processing section 71 notifies the operator of execution of, for example, an angle adjustment of the optical members described above.

In addition, if current row interval Ns is equal to the initial row-direction interval (Ls1+Ls2) while current column interval Nv is different from the initial column-direction interval (Lv1+Lv2), it means that a positioning error is occurring in the lifting and lowering direction, for example, such as an error in which suction nozzle 2I has not been lifted up to an lifting end, or the like. Then, if the first imaging target and the second imaging target maintain the initial row-direction interval (Ls1+Ls2) (S1I: Yes), image processing section 71 executes an error processing based on an assumption that an operation error is occurring in driving device 22, which functions as the lifting and lowering device (S23). Specifically, image processing section 71 notifies the operator of execution of maintenance on, for example, driving device 22 and rotary head 23.

5. Advantageous Effects Provided by Configuration of Embodiment

Component mounter 1 of the embodiment includes camera device 51 configured to image an imaging target that falls within camera visual field 95 and optical device 60 configured to form light paths corresponding individually to three or more imaging targets and collect the three or more light paths so formed so as to enable the imaging targets to fall within camera visual field 95 while being aligned in the row direction and the column direction that is orthogonal to the row direction in camera visual field 95.

In addition, component mounter 1 of the embodiment includes camera device 51 configured to image an imaging target that falls within camera visual field 95 and optical device 60 configured to change optically the positional relationship among three or more imaging targets so that the three or more imaging targets are allowed to fall within camera visual field 95 while being aligned in the row direction and the column direction that is orthogonal to the row direction in camera visual field 95.

With such a configuration, the multiple light paths are collected so that the three or more imaging targets can simultaneously be imaged while being aligned in the row direction and the column direction in camera visual field 95 of camera device 51. As a result, the three or more imaging targets fall within image data 80, which is obtained through imaging by camera device 51, while being caused to deviate in the left-right direction and the up-down direction. Thus, as compared with the conventional configuration in which the multiple imaging targets are caused to fall within the image data while being aligned in the left-right direction, with the configuration of the present embodiment, the occupied area of each of the imaging targets can be secured sufficiently in the left-right direction of image data 80.

6. Variation of Embodiment

In the embodiment, head camera unit 50 images four suction nozzles 21 in eight suction nozzles 21 that are supported by mounting head 20 and components 91 held by those four suction nozzles 21 as its imaging targets. On the other hand, head camera unit 50 can adopt various forms as long as head camera unit 51 includes optical device 60 configured to collect three or more light paths so as to enable three or more imaging targets to be imaged.

In the present description, the imaging target includes at least one of suction nozzle 21 (the holding member), component 91 held by that suction nozzle 21 (the holding member), and a constituent member of mounting head 20. As a result, head camera unit 50 may image as an imaging target a different type of chuck as a holding member in place of suction nozzle 21. In addition, the constituent members of mounting head 20 can include, for example, a syringe for supporting suction nozzle 21, a collar provided on an outer peripheral side of the syringe for use for maintaining a supported state of suction nozzle 21, and the like.

In addition, optical device 60 can adopt various types of modes as long as optical device 60 collects light paths of mappings of three or more imaging targets so that two or more mappings in the three or more mappings are aligned in two or more rows in the row direction and in two or more columns in the column direction, in other words, so that the positional relationship among three or more imaging targets is changed optically. Specifically, in a case that there are three imaging targets, optical device 60 may be configured to align the three imaging targets in camera visual field 95, as shown in FIGS. 8A and 8B.

Further, in a case that there are four imaging targets, optical device 60 may be configured to form a space in a center section of camera visual field 95 so that the four imaging objects are aligned along a circumference of the space so formed in camera visual field 95, as shown in FIG. 9. In addition, in a case that there are six imaging targets, optical device 60 may be configured to align the six imaging targets in camera visual field 95 into a configuration of two rows in the row direction and three columns in the column direction in camera visual field 95, as shown in FIG. 10. In this mode, in addition to the configuration exemplified in the embodiment, mappings 87, 88 are combined so as to generate first combined mapping 85 at the center of camera visual field 95 in the row direction.

In addition, in the present description, in a case that a single holding member or single component 91 held by the single holding member is imaged from predetermined directions that are different from each other or one another with respect to mounting head 20, images resulting from the imaging are treated as different imaging targets. That is, for example, three or more imaging targets may be set so as to image single suction nozzle 21 from three directions that are different from one another, or three or more imaging targets may be set so as to image single suction nozzle 21 from different angles for two of four imaging targets.

In the embodiment, image processing section 71 is described as being incorporated in control device 70 of component mounter 1. In contrast to this, image processing section 71 may be configured to be incorporated in an interior of head camera unit 50 provided on mounting head 20. These modes can be selected as required in consideration of the processing load, communication speed, unit weight, and the like of head camera unit 50.

REFERENCE SIGNS LIST

1: component mounter, 20: mounting head, 21: head main body, 22: driving device, 23: rotary head, 21: suction nozzle (imaging target), 25: housing, 50: head camera unit, 51: camera device, 52: bracket, 53: light source, 51: backing member, 60: optical device, 61A, 61B, 61C: front objective mirror (optical member), 62A, 62B, 62C: rear objective mirror (optical member), 63: side prism, 61: first side mirror (first reflection member), 65: second side mirror, 66: center prism, 67: center mirror (second reflection member), 70: control device, 71: image processing section, 80: image data, 81 to 81: mapping, 85: first combined mapping, 86: second combined mapping, 90: board, 91: component (imaging target), 95: camera visual field.

The invention claimed is:

1. A component mounter comprising:
a mounting head configured to support one or multiple holding members for holding a component in such a manner as to enable the one or multiple holding members to be lifted up and lowered;
a camera device provided on the mounting head and configured to image an imaging target that falls within a camera visual field; and
an optical device configured to form light paths corresponding individually to three or more imaging targets like the imaging target each including at least one of the holding member, the component held by the holding member, and a constituent member of the mounting head and collect the three or more light paths so formed so as to enable the imaging targets to fall within the camera visual field while being aligned in a row direction and a column direction that is orthogonal to the row direction in the camera visual field,
wherein the optical device includes pairs of front objective mirrors, pairs of rear objective mirrors, a pair of side prisms, a pair of first side mirrors, a pair of second side mirrors, a center prism, and a center mirror, each pair of front objective mirrors, each pair of rear objective mirrors, the pair of side prisms, the pair of first side mirror, and the pair of second side mirrors being substantially symmetrically arranged in a left-right direction with respect to the mounting head, and
wherein the front objective mirrors of each pair of front objective mirrors form a first light path of the three or more light paths enabling a first mapping, the rear objective mirrors of each pair of rear objective mirrors form a second light path of the three or more light paths enabling a second mapping, the side prism of each pair of side prisms combines the first and second mappings that are incident thereon in an up-down direction into a first combined mapping, the first side mirror of each pair of side mirrors reflects the first combined mapping that is incident thereon from the side prism to the camera device, the second side mirror of each pair of side mirrors reflects the first combined mapping that is incident thereon from the first side mirror towards a center of the mounting head in the left-right direction so as to be incident on the center prism, the center prism combines two first combined mappings that are incident thereon in the left-right direction so as to generate a second combined mapping in which the two first combined mappings are aligned in the left-right direction, and the center mirror reflects the second combined mapping that is incident thereon from the center prism towards the camera device.

2. The component mounter according to claim 1, wherein the optical device forms the three or more light paths in such a manner that a length of the three or more light paths falls within a permissible range based on a depth of field of the camera device.

3. A component mounter comprising:
a mounting head configured to support one or multiple holding members for holding a component in such a manner as to enable the one or multiple holding members to be lifted up and lowered;
a camera device provided on the mounting head and configured to image an imaging target that falls within a camera visual field; and
an optical device configured to optically change a positional relationship among three or more imaging targets like the imaging target each including at least one of the holding member, the component held by the holding member, and a constituent member of the mounting head so as to enable the three or more imaging targets to fall within the camera visual field while being aligned in a row direction and a column direction that is orthogonal to the row direction in the camera visual field,
wherein the optical device includes pairs of front objective mirrors, pairs of rear objective mirrors, a pair of side prisms, a pair of first side mirrors, a pair of second side mirrors, a center prism, and a center mirror, each pair of front objective mirrors, each pair of rear objective mirrors, the pair of side prisms, the pair of first side mirror, and the pair of second side mirrors being substantially symmetrically arranged in a left-right direction with respect to the mounting head, and
wherein the front objective mirrors of each pair of front objective mirrors form a first light path enabling a first mapping, the rear objective mirrors of each pair of rear objective mirrors form a second light path enabling a second mapping, the side prism of each pair of side prisms combines the first and second mappings that are incident thereon in an up-down direction into a first combined mapping, the first side mirror of each pair of side mirrors reflects the first combined mapping that is incident thereon from the side prism to the camera device, the second side mirror of each pair of side mirrors reflects the first combined mapping that is incident thereon from the first side mirror towards a center of the mounting head in the left-right direction so as to be incident on the center prism, the center prism combines two first combined mappings that are incident thereon in the left-right direction so as to generate a second combined mapping in which the two first combined mappings are aligned in the left-right direction, and the center mirror reflects the second combined mapping that is incident thereon from the center prism towards the camera device.

4. The component mounter according to claim 1, wherein the three or more imaging targets comprise the holding member or the component held by the holding member that are imaged from a predetermined direction with respect to the mounting head.

5. The component mounter according to claim 4, wherein the mounting head supports four or more holding members like the holding member, and
wherein the optical device causes four imaging targets like the imaging target to fall within the camera visual field with each two in the four imaging targets being aligned in the row direction and the column direction.

6. The component mounter according to claim 4, wherein the optical device causes two imaging targets, that is, a first imaging target and a second imaging target in the three or more imaging targets to fall within the camera visual field while being aligned in the column direction in such a state that the first imaging target and the second imaging target are reversed to each other in an up-down direction and a left-right direction.

7. The component mounter according to claim 3, wherein the first side mirror is provided at a center section in the mounting head in a direction in which the first imaging target and the second imaging target are disposed.

8. The component mounter according to claim 3, further comprising:
an image processing section configured to estimate, when a displacement from a reference position of image data that is obtained through imaging by the camera device in the row direction or the column direction is occurring in at least one of the first imaging target and the second imaging target, a cause for the occurrence of the displacement based on a positional relationship between the first imaging target and the second imaging target in the image data.

9. The component mounter according to claim 8, wherein the image processing section estimates that a placement error of the second reflection member constitutes a cause for the occurrence of the displacement when the first imaging target and the second imaging target maintain an initial interval therebetween in the image data.

10. The component mounter according to claim 8, wherein the image processing section estimates that a placement error of an optical member that is provided closer to the first imaging target or the second imaging target than the first side mirror or a positioning error of the holding member in the up-down direction constitutes a cause for the occurrence of the displacement when the first imaging target and the second imaging target do not maintain an initial interval therebetween in the image data.

11. The component mounter according to claim 1, wherein the holding member is a suction nozzle configured to pick up and hold the component by a negative pressure air supplied thereto.

* * * * *